United States Patent [19]

Paoli et al.

[11] Patent Number: 4,831,629
[45] Date of Patent: May 16, 1989

[54] INCOHERENT, OPTICALLY UNCOUPLED LASER ARRAYS WITH INCREASED SPECTRAL WIDTH

[75] Inventors: Thomas L. Paoli, Los Altos, Calif.; Robert D. Burnham, Wheaton, Ill.; Robert L. Thornton, East Palo Alto, Calif.

[73] Assignee: Xerox Corporation, Stamford, Conn.

[21] Appl. No.: 91,819

[22] Filed: Sep. 1, 1987

[51] Int. Cl.$^4$ ............................................. H01S 3/19
[52] U.S. Cl. ...................................... 372/50; 372/23; 372/46; 372/97
[58] Field of Search ...................... 372/50, 46, 23, 97

[56] References Cited

U.S. PATENT DOCUMENTS

| | | | |
|---|---|---|---|
| 4,594,719 | 6/1986 | Ackley | 372/50 |
| 4,603,421 | 7/1986 | Scifres et al. | 372/50 |
| 4,694,459 | 9/1987 | Burnham et al. | 372/45 |
| 4,719,632 | 1/1988 | Lindsey et al. | 372/50 |
| 4,751,711 | 6/1988 | Welch et al. | 372/46 |

FOREIGN PATENT DOCUMENTS

| | | | |
|---|---|---|---|
| 0066889 | 4/1985 | Japan | 372/50 |
| 0130184 | 7/1985 | Japan | 372/50 |

OTHER PUBLICATIONS

Carney et al; "Double-Heterojunction . . . Contacts"; Appl. Phys. Lett.; 38(5); 1 Mar. 1981; pp. 303–305.

Primary Examiner—William L. Sikes
Assistant Examiner—Xuân Thi Võ
Attorney, Agent, or Firm—W. Douglas Carothers, Jr.

[57] ABSTRACT

An optically uncoupled laser array is modified at its current confinement geometry to introduce nonuniformity in effective optical cavity width and/or length among the different lasers comprising the laser array. An array laser comprising a plurality of spaced lasing elements with an optical cavity for generating and propagating radiation under lasing conditions with each of the laser elements being optically uncoupled from one another is enhanced by an extended spectral emission linewidth and reduction in temporal coherence. This extended spectral emission linewidth and reduction in temporal coherence is accomplished by changing the gravity gain or loss for at least a majority of the laser elements relative to each other whereby a different longitudinal mode(s) of operation and frequency of operation exist for each such laser element. The enhancement may be accomplished, for example, by providing nonuniformity in the current confinement width or nonuniformity in the effective current pumped region or a change in optical cavity absorption loss for at least a majority of laser elements. Such nonuniformity or change may be randomly varying or monotonically increasing or decreasing across the laser elements of the array.

8 Claims, 4 Drawing Sheets

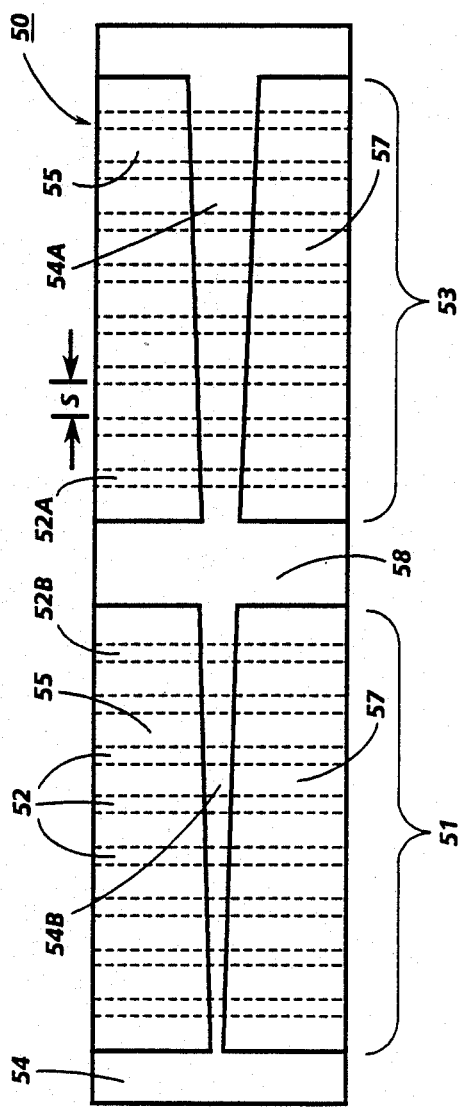

INCOHERENT, OPTICALLY UNCOUPLED LASER ARRAYS WITH INCREASED SPECTRAL WIDTH

BACKGROUND OF THE INVENTION

This invention relates to optically uncoupled or non-phase locked semiconductor laser arrays and more particularly to optically uncoupled laser arrays modified to have an overall increased spectral emission bandwidth. An array of closely spaced but optically uncoupled diode lasers has been proposed and developed for electro-optic line modulators and line printers. An example of such a laser array is disclosed in U.S. patent application Ser. No. 808,197 filed Dec. 12, 1985 entitled, "INCOHERENT, OPTICALLY UNCOUPLED LASER ARRAYS FOR ELECTRO-OPTIC LINE MODULATORS AND LINE PRINTERS". In that disclosure, an incoherent diode laser array source is employed as a single solid state light source capable of providing a sheetlike, uniform and high intensity of light. The uncoupled array comprises a series of monolithic index guided diode lasers on a single substrate with their index waveguide cavities formed by layer impurity induced disordering. The essential ingredient is that the individual lasers or emitters of such an laser array operate randomly phased with respect to each other, i.e., they are not sufficiently evanescently coupled to be in phase with each other. If each laser in the array oscillates independently of the other lasers, its optical phase and/or frequency will randomly drift and, as a result, permit optical interference to exist only within the beam of each individual laser rather than among or between the beams of adjacently positioned diode lasers of the array.

Although such laser arrays exhibit the desired single lobe, far field radiation patterns desired for electro-optic line modulators, their optical spectra are narrower than the emission spectra of an LED. The bandwidth or linewidth of these laser arrays are narrower because all the lasers in the array are fabricated to be nominally identical and each laser oscillates in predominately one longitudinal mode relative to their cavities of substantially equal length. Any spectral width in the total emission arises only due to small but unintentional differences existing in the geometrical and optical parameters between the spatial emitters. Also, it is possible that the temporal coherence of these laser arrays will be too large to eliminate optical interference effects which arise from light scattering due to scratches, dust and other foreign micro particles present in the optical system of the modulator or printer.

It is an object of this invention to provide means in the laser array structure to force the individual emitters in the array to lase at different longitudinal modes to thereby increase the overall spectral emission bandwidth of the array laser.

It is another object of this invention to reduce temporal coherence in optically uncoupled index guided array lasers.

SUMMARY OF THE INVENTION

According to this invention, an optically uncoupled laser array is modified at its current confinement geometry to introduce nonuniformity in effective optical cavity width and/or length among the different lasers comprising the laser array. An array laser comprising a plurality of spaced lasing elements with an optical cavity for generating and propagating radiation under lasing conditions with each of the laser elements being optically uncoupled from one another is enhanced by an extended spectral emission linewidth and reduction in temporal coherence. This extended spectral emission linewidth and reduction in temporal coherence is accomplished by changing the gravity gain or loss for at least a majority of the laser elements relative to each other whereby a different longitudinal mode(s) of operation and frequency of operation exist for each such laser element. The enhancement may be accomplished, for example, by providing nonuniformity in the current confinement width or nonuniformity in the effective current pumped region or a change in optical cavity absorption loss for at least a majority of laser elements. Such nonuniformity or change may be randomly varying or monotonically increasing or decreasing across the laser elements of the array.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 4 is a multiple embodiment of an optically uncoupled laser array of the embodiment shown in FIG. 2.

FIG. 5 is an extended embodiment of an optically uncoupled laser array of the embodiment shown in FIG. 2.

DETAILED DESCRIPTION OF THE PREFERRED EMBODIMENTS

Figure 1:
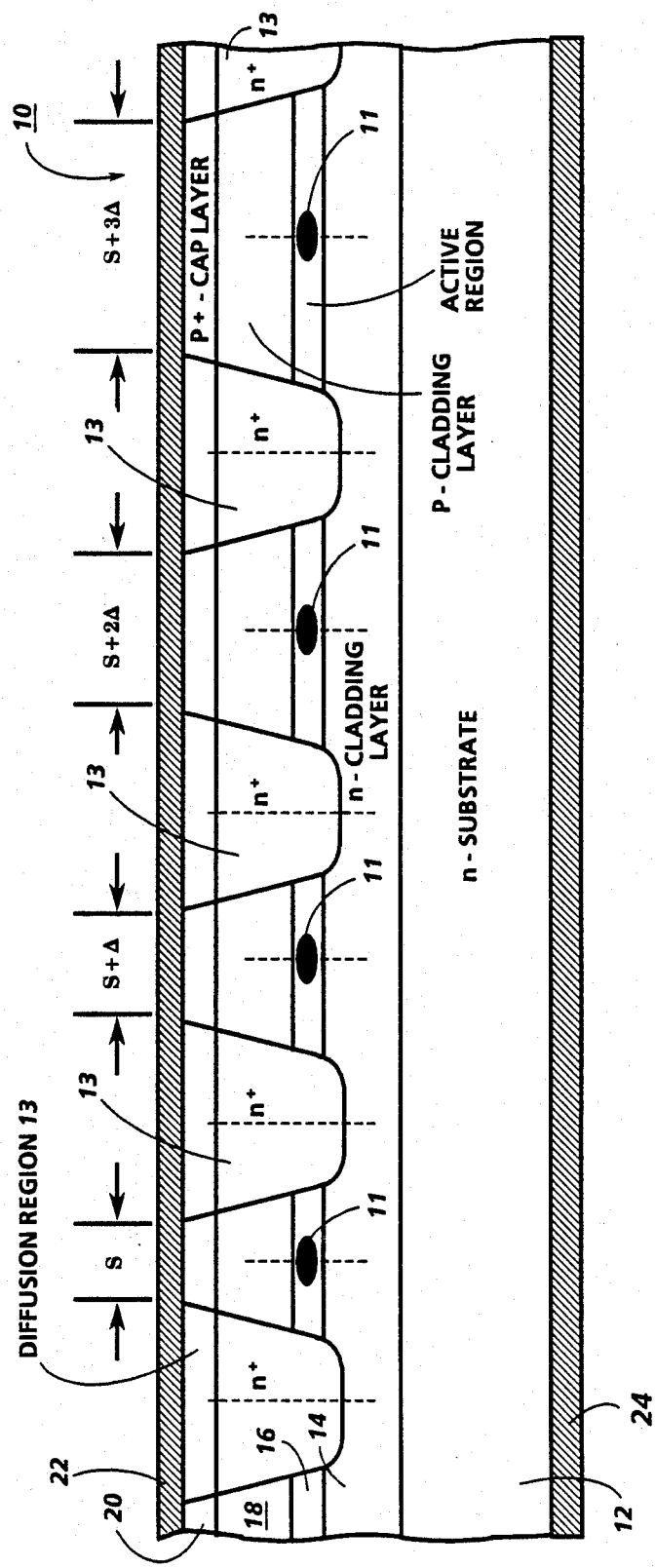
FIG. 1 is a schematic view of side elevation of an embodiment of an optically uncoupled laser array comprising this invention.

Disclosed are two different generic embodiments for reducing temporal coherence and cause lasing in different longitudinal modes in an optically uncoupled laser array. The first embodiment is shown in FIG. 1 wherein the laser emitters of the array are fabricated with unequal current confinement or stripe widths or progressively different optical cavity widths. The second embodiment is shown in FIGS. 2-7 wherein nonuniform pumping is achieved through nonuniform or unequal current confinement geometry. U.S. Pat. No. 4,594,719 discloses different center to center spacing among laser elements for a particular function unrelated to this disclosure and is provided with uniform width current confinement strips. In the invention herein, the current confinement widths of the spaced laser elements are not identical and the array of laser elements are not phase locked.

In the explanation of these two embodiments, it should be realized that every laser element of an array laser need not have a nonuniformity in effective optical cavity width and/or length among the different laser elements, as it will be realized by those skilled in the art that only a substantial number, e.g. a majority, of laser elements in the array laser need have a different nonuniformity to be significantly effective in extending the spectral linewidth or bandwidth of emission of the laser.

Reference is now made to FIG. 1 wherein there is disclosed the first embodiment of this invention. Optically uncoupled array laser 10 comprises a plurality of closely spaced laser elements or emitters 11 formed by laser impurity induced disordering (IID) or other techniques as are well known in the art. Only four emitters 11 are shown for the sake of expediency and simplicity. Obviously, additional emitters may be included. Laser 10 comprises a n-GaAs 12 upon which is epitaxially deposited the following layers: cladding layer 14 of n-Ga$_{1-x}$Al$_x$As where x may, for example, be equal to 0.4 and the layer may be about 1.5 $\mu$m thick; active region 16 comprising an active layer or a single quantum well structure or a multiple quantum well structure, for example, four GaAs quantum well layers each 10 nm thick separated by barrier Ga$_{0.65}$Al$_{0.35}$As layers each 7 nm thick; cladding layer 18 of p-Ga$_{1-x}$Al$_x$As where x may, for example, be equal to 0.4 and the layer may be about 0.8 $\mu$m thick; and cap layer 20 of p+GaAs being about 0.1 $\mu$m thick. The active region may be p doped, n doped or undoped.

The processing of laser array 10 begins with the deposition of a film of Si$_3$N$_4$ of about 100 nm thick. This film is photolithographically patterned to provide windows or openings for forming regions 13 via Si diffusion. Next, an approximately 50 nm thick film of silicon is deposited on the array, followed by another film of Si$_3$N$_4$ of approximately 100 nm thickness. Diffusion is performed at 850° C. for about 7.5 hours to disorder the active region in areas adjacent to what will eventually become the lasing filaments as represented by emitters 11.

The current confinement spacing for emitters 11 is unequal. The spacing, S, between the first two diffusion regions 13 is smaller than the spacing between the next two regions, i.e., S+$\Delta$, and so on, so that the linear progression of increase in current confinement or stripe width is S, S+$\Delta$, S+2$\Delta$, S+3$\Delta$, S+n$\Delta$... As an example, S may equal 1 $\mu$m and $\Delta$ may be in the range of 0.5 $\mu$m, or example. However, this range is not at all intended to be exclusive. Further, $\Delta$ need not be of the same value in between regions 13 but rather may be a different value between each pair of diffusion regions 13. The forgoing also applies with respect to all subsequent embodiments to be discussed.

The n-type Si diffusion regions 13 preferably extend through active region 16. It is preferred that the diffusion extend through the active layer and any layers that form a part of or function as part of the optical cavity of each laser element. In this regard, the diffusion may be best to extend partly into lower cladding layer 14 depending, for example, upon the percentage of aluminum in the inner cladding layers. If additional inner confinement layers are provided with the active region, it is preferred that the diffusion extend through such confinement layers since they are part of the laser element optical cavity. The result to be realized is that the diffusion must extend sufficiently through the optical cavity of each laser element to prevent stable phase locking between adjacent emitters due to overlap of the evanescent optical wave extending between adjacent laser cavities. The diffusion regions 13 provide both optical confinement of this wave as well as carrier confinement to the individual laser cavities represented by the emitters 11 so that the individual laser elements may be closely spaced, starting with S approximately equal to 1 $\mu$m, without being optically coupled to one another.

After the diffusion, the Si layer and both Si$_3$N$_4$ layers are removed by etching in a CF$_4$ plasma. The entire surface of array 10 may then be Zn-diffused to reconvert the n-type Si-diffused GaAs cap layer 20 and part of cladding layer 18 to p-type material (not shown) to avoid any functional problems with the parasitic p-n junction that is in parallel with the active region lasing junction.

Laser array 10 is metallized with Cr—Au or Ti—Pt—Au contact 22 on cap layer 20 and alloyed with Au—Ge, followed by Cr—Au or Ti—Pt—Au as contact 24 on the bottom surface of substrate 12.

The voltage bias to each laser emitter 11 will be approximately the same when applied across contacts 22 and 24. However, since each emitter 11 has a different pumping width, lasing in each laser cavity will occur at a different carrier density and total current. Due to the employment of layers exhibiting quantum size effects in active region 16, enhanced bandfilling will occur so that different increments of bandfilling will occur for different widths of current confinement to laser emitters 11 resulting in different emission wavelengths and different spectral emission bandwidths for each of the arrays. Thus, the difference in current confinement width enhance the differences between the wavelengths at which the spatial emitters will emit radiation.

Figure 2:
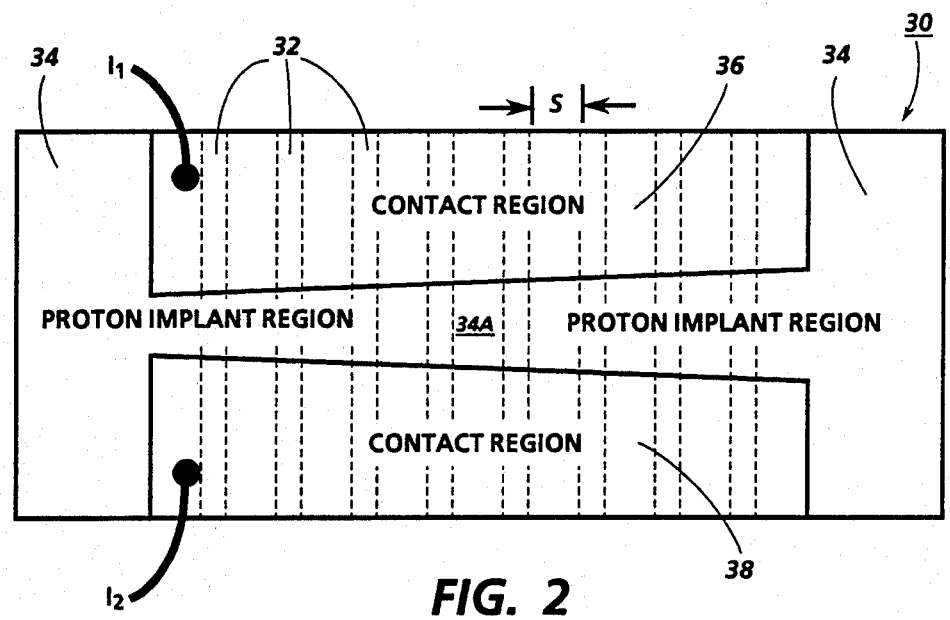
FIG. 2 is a schematic plan view of another embodiment of an optically uncoupled laser array comprising this invention.

Reference is now made to FIG. 2 wherein there is disclosed the second embodiment of this invention. Optically uncoupled array laser 30 comprises a plurality of closed spaced laser elements or emitters 11 formed by layer impurity induced disordering (IID) in the manner as previously explained in connection array laser 10 or any other technique. However, all of laser emitters 32 are uniformly spaced at a distance, S. The contact configuration on the top of laser 30 is nonuniform to bring about nonuniform current distribution among the several laser elements or emitters 32. Metal contact regions 36 and 38 are regions that are current pumped relative to each laser element while isolation region 34 is insulated from any current penetration. Isolation region 34 may be formed by ion implantation or by proton implantment, e.g., proton implant at an energy of 70 keV with a dose of 3×10$^{15}$. Isolation may also be accomplished with an insulating layer on the top epitaxial layer of the device. To be noted is that central isolation region 34A has a laterally varying width relative to adjacent contact regions 36 and 38 so that total cavity length for each laser element current pumped beneath contact regions 36 and 38 is not identical. Current pumping is confined to contact regions 36 and 38 wherein, for example, $I_1 = I_2$. Current flow through only regions 36 and 38 produces nonuniformity in carrier density and gain in each laser cavity and, consequently, will characteristically provide a different operating current threshold for each laser emitter 32. Thus, by varying the degree of nonuniformity across the lateral dimension of array laser 30, a lateral nonuniformity in operating current threshold of the individual laser elements will occur. These different operating current thresholds will cause the individual laser elements to operate at different emission wavelengths thereby broadening the total spectral linewidth or bandwidth of array laser 30.

Another aspect of the embodiment of FIG. 2 is that contact regions 36 and 38 of array laser 30 may be pumped at different currents, $I_1$ and $I_2$, e.g., $I_1 > I_2$. This has the effect of also changing, in a more enhanced manner, the current density among emitters 32 to broaden further the emission wavelengths of the individual emitters.

Many other contact region geometries are possible for broadening the spectral linewidth of an array laser. FIGS. 3-7 disclose other such embodiments.

Figure 3:
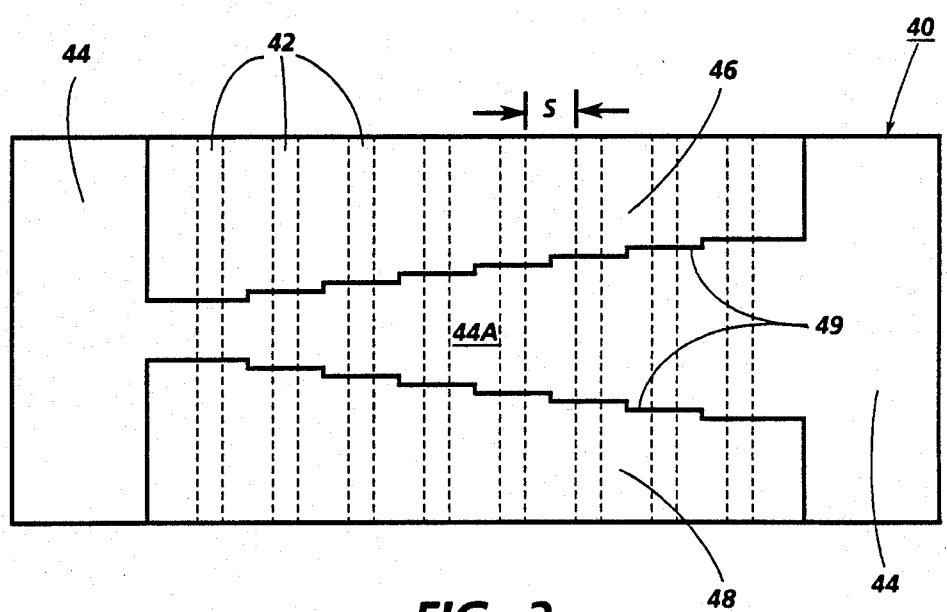
FIG. 3 is modified embodiment of an optically uncoupled laser array of the embodiment shown in FIG. 2.

In FIG. 3, array laser 40 is generally the same as array laser 30 in FIG. 2 except that the inner edges of metal contact regions 46 and 48 defining inner isolation region 44A of isolation region 44 have a stair stepped configuration 49. This configuration provides a more abrupt nonuniformity in the affected cavity lengths of the different individual laser elements 42 to be pumped.

The technique of nonuniform current pumping illustrated in FIGS. 2 and 3 can also be utilized to fabricate separate but monolithic laser arrays which emit with different spectral emission bandwidths, which separate bandwidths are centered about different dominate wavelengths of operation for the individual arrays. Such a dual wavelength, monolithic laser array 50 is illustrated in FIG. 4. Monolithic laser array 50 comprises two sections of array lasers 51 and 53 comprising independent groupings of laser emitters 52 separated by central isolation region 58 forming a part of isolation region 54. Each laser section 51 and 53 has metal contact region 55 and 57 but the spatial variance between these contacts in isolation region 54B of isolation region 54 in laser 51 is closer together compared to isolation region 54A for laser 53, so that the maximum loss due to the extent of loss of active cavity pumping for laser emitter 52A will be greater than that for laser emitter 52B. By controlling the average increase in current threshold of each laser array 51 and 53 by the spatial variation of separation between the respective pairs of contact regions 55 and 57, the center or dominate emission wavelength of each array 51 and 53 can selected. This particular dual wavelength embodiment has particular utility in increasing the resolution of electro-optic line modulators and printers.

As in the case of previous embodiments, the individual contact regions 55 and 57 of each laser array 51 and 53 may be each pumped at the same current or at different pumping currents, e.g., $I_1$ and $I_2$, or $I_1$, $I_2$, $I_3$ and $I_4$.

FIG. 5 illustrates an array laser 60 with a broad beam width with a dominate central emission wavelength. Laser 60 includes a plurality of emitters 62 with an isolation region 64 having an inner isolation region 64A of varying width, between current pumping contact regions 66 and 68. Inner isolation region 64A has an increasing spatial variation to the center of laser 60 and then a decreasing spatial variation to the opposite end of laser 60.

Figure 6:
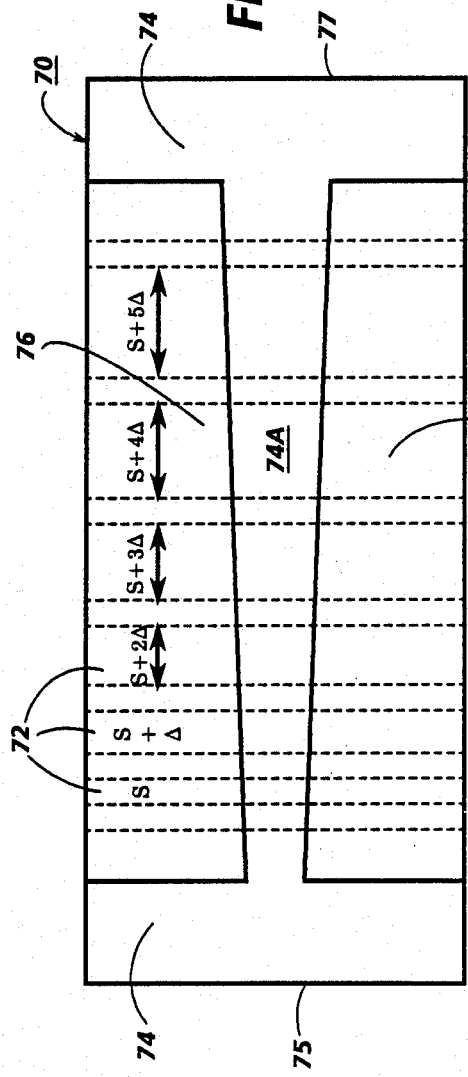
FIG. 6 is combination embodiment of the embodiments shown in FIGS. 1 and 2.
Figure 7:
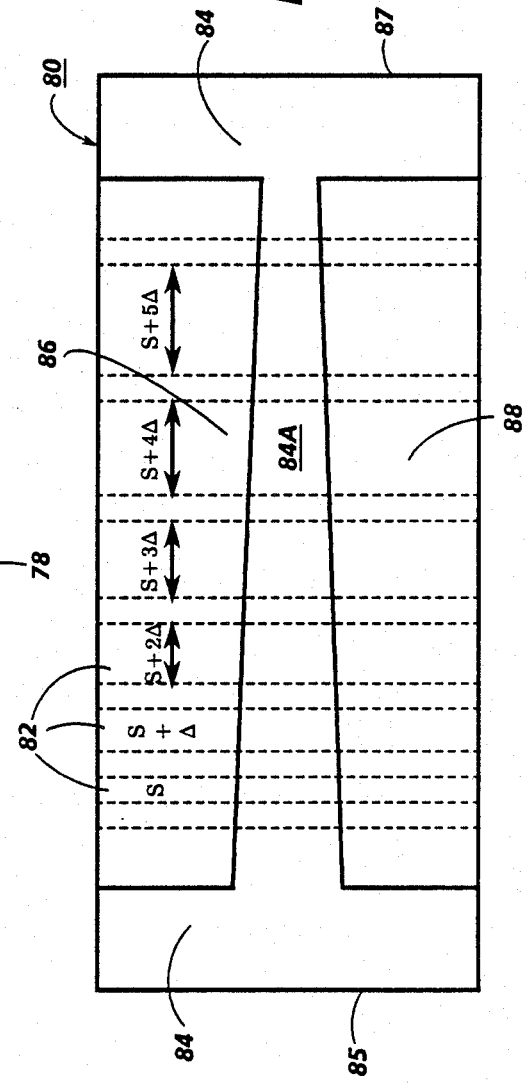
FIG. 7 is another combination embodiment of the embodiments shown in FIGS. 1 and 2.

The techniques of the first and second embodiments described above may be combined to effect spectral emission bandwidth of an array laser. FIGS. 6 and 7 illustrate embodiments of such combinations to achieve this result. In FIG. 6, array laser 70 comprises a series of spaced emitters 72 having different spatial optical cavity widths which linearly increasing from one end 75 of the array, S to $S+n\Delta$, laterally across the array to the opposite end 77 of the array, in combination with isolation region 74 having an inner isolation region 74A of increasing spatial variation from the same one end 75 of the array laterally across the array to the opposite end 77 of the array.

In FIG. 7, array laser 80 comprises a series of spaced emitters 82 having different spatial separation which linearly increase from one end 85 of the array, S to $S+n\Delta$, laterally across the array to the opposite end 87 of the array, in combination with isolation region 84 having an inner isolation region 84A of increasing spatial variation from the opposite end 87 of the array laterally across the array to the first mentioned end 85 of the array. The change in wavelength emission across the array would be a monotonical increase in wavelength from left to right across the array.

In the combination of FIG. 7, the spectral width would be further enhanced whereas in FIG. 6, the spectral width would be compensated so that, in end result, the effect of broadened spectral width accomplished in the FIG. 7 embodiment would be of a greater magnitude compared to the FIG. 6 embodiment.

Another way of introducing nonuniformity in longitudinal mode operation of an optically uncoupled array laser is by introducing a nonuniform loss in absorption rather current density or gain among the individual laser cavities of the array. This can be accomplished by introducing absorption loss along a portion of the optical cavities of some or all of the laser elements. One way of accomplishing this loss introduction is by the diffusion of an impurity along a portion of the optical cavity of each laser element to lower the bandgap therealong. Another manner of accomplishing this is to narrow the waveguide width along such optical cavity portions. A further way would be to proton implant into the active layer or region along such optical cavity portions. In all these cases, the length of these portions would be nonuniform or unequal among the laser emitters.

A further way would be nonuniformly coating one of the array laser facets along its lateral extent with a reflecting mirror coating of continuously, laterally varying level of reflectivity so that the level of optical feedback to the respective individual emitters across the array would differ from one another. Also, the temporal coherence of an uncoupled array laser may be decreased by applying an antireflective (AR) coating to one or both mirror facts of the laser or by fabricating the longitudinal axis of the array laser optical cavities to be at a small angle relative to the plane of the cleaved facets.

Further, as previously indicated, the nonuniformity or changes across the array in current confinement widths, effective pumped regions, optical cavity absorption loss or effective optical cavity width may be randomly varying laterally across the laser elements of the array or may monotonically increase or decrease laterally across the laser elements of the array.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. In an array laser comprising a plurality of spaced lasing elements each with an optical cavity for generating and propagating radiation under lasing conditions, means to maintain said elements in unlocked phase so that the phases of the individual modes of each of said elements are random with respect to each other in combination with means to introduce absorption loss along a portion of said laser optical cavities for at least a majority of said laser elements relative to each other wherein the longitudinal extent of each said absorption loss portions are of varying length whereby a different longitudinal mode of operation exists for each of said majority of laser elements, said combination achieving an extended spectral emission linewidth and reduction in temporal coherence in the output emission of said array laser.

2. In an array laser comprising a plurality of spaced lasing elements each with an optical cavity for generating and propagating radiation under lasing conditions, means to maintain said elements in unlocked phase so that the phases of the individual modes of each of said elements are random with respect to each other, said means formed between each of said elements to provide current confinement means for said elements evanescent optical wave extension and optical coupling between adjacent so that said elements will not operate in a phase locked condition, said current confinement means for at least a majorty of said laser elements being individually of a different dimensional width across said array laser whereby a different longitudinal mode of operation exists for each of said majority of laser elements, the combination of unlocked phase and multi-longitudinal mode operation achieving an extended spectral emission linewidth and reduction in temporal coherence in the output emission of said array laser.

3. In an array laser comprising a plurality of spaced lasing elements each with an optical cavity for generating and propagating radiation under lasing conditions, means to maintain said elements in unlocked phase so that the phases of the individual modes of each of said elements are random with respect to each other, said means formed between each of said elements to provide current confinement means for said elements so that said elements will not operate in a phase locked condition, an absorption loss region in a portion of the effective current pumped length of each of said current confinement means for at least a majority of said laser elements, each of said loss regions having a different length whereby a different longitudinal mode of operation exists for each of said majority of laser elements, the combination of unlocked phase and multi-longitudinal mode operation achieving an extended spectral emission linewidth and reduction in temporal coherence in the output emission of said array laser.

4. The array laser of claim 3 wherein said effective current pumped length for each laser element comprises a single conductive contact region on said array laser extending laterally across said array, said contact region havig a monotonically increasing or decreasing change in width thereacross.

5. The array laser of claim 3 wherein there are two spaced array lasers formed as a monolithic laser array separated by an integral isolation region producing two spatial dominate wavelengths with separate extended spatial emission linewidths.

6. In an array laser comprising a plurality of spaced lasing elements each with an optical cavity for generating and propagating radiation under lasing conditions, means to maintain said elements in unlocked phase so that the phases of the individual modes of each of said elements are random with respect to each other, said means formed between each of said elements to provide current confinement means for said elements so that said elements will not operate in a phase locked condition, said current confinement means for at least a majority of said laser elements and the effective current pumped length of said current confinement means for at least a majority of said laser elements being respectively of a different dimensional width and length across said array whereby a different longitudinal mode of operation exists for each of said majority of laser elements, the combination of unlocked phase and multi-longitudinal mode operation achieving an extended spectral emission linewidth and reduction in temporal coherence in the output emission of said array laser.

7. The method of reducing temporal coherence in an optically uncoupled array laser comprising a plurality of spaced elements each with an optical cavity for generating and propagating radiation under lasing conditions comprising the step of:
forming means between adjacent elements to maintain said elements in unlocked phase so that the phases of the individual modes of each of said elements are random with respect to each other so that said elements will not operate in a phase locked condition and
varying the effective optical cavity widths of at least a majority of the lasing elements so that the longitudinal modes relative to each of said laser elements are different,
the combination of said steps extending the enhancement of the overall spectral emission linewidth of the array laser.

8. The method of reducing temporal coherence in an optically uncoupled array laser comprising a plurality of spaced elements each with an optical cavity for generating and propagating radiation under lasing conditions comprising the steps of:
forming means between adjacent elements to maintain said elements in unlocked phase so that the phases of the individual modes of each of said elements are random with respect to each other so that said elements will not operate in a phase locked condition and
varying the effective optical cavity lengths of at least a majority of the lasing elements so that the longitudinal modes relative to each of said laser elements are different,
the combination of said steps extending the overall enhancement of the spectral emission linewidth of the array laser.

* * * * *